US012625212B2

(12) United States Patent
Wang et al.

(10) Patent No.: US 12,625,212 B2
(45) Date of Patent: May 12, 2026

(54) SYSTEMS AND METHODS OF ARTIFACT REDUCTION IN MAGNETIC RESONANCE IMAGES

(71) Applicant: GE Precision Healthcare LLC, Wauwatosa, WI (US)

(72) Inventors: Xinzeng Wang, Houston, TX (US); Sagar Mandava, Atlanta, GA (US); Xucheng Zhu, Mountain View, CA (US)

(73) Assignee: GE PRECISION HEALTHCARE LLC, Wauwatosa, WI (US)

( * ) Notice: Subject to any disclaimer, the term of this patent is extended or adjusted under 35 U.S.C. 154(b) by 407 days.

(21) Appl. No.: 18/330,647

(22) Filed: Jun. 7, 2023

(65) Prior Publication Data

US 2024/0410966 A1      Dec. 12, 2024

(51) Int. Cl.
*G01R 33/56* (2006.01)
*G06T 5/50* (2006.01)
(Continued)

(52) U.S. Cl.
CPC ............ *G01R 33/5608* (2013.01); *G06T 5/50* (2013.01); *G06T 5/73* (2024.01); *G06T 7/0012* (2013.01);
(Continued)

(58) Field of Classification Search
CPC ............ G01R 33/5608; G01R 33/4824; G01R 33/565; G01R 33/54; G01R 33/58;
(Continued)

(56) References Cited

U.S. PATENT DOCUMENTS 11,519,992 B2   12/2022  Brada
2018/0059195 A1*  3/2018  Lai ...................... G01R 33/565
(Continued)

FOREIGN PATENT DOCUMENTS

EP        4009268 A1 *   6/2022   ............... G06T 5/70

OTHER PUBLICATIONS

Juran, Ralf & Rogalla, Patrik. (2008). softMip: A Novel Projection Algorithm for Ultra-Low-Dose Computed Tomography. Journal of computer assisted tomography. 32. 480-4. 10.1097/RCT. 0b013e31812e4b37. (Year: 2008).*
(Continued)

*Primary Examiner* — Chan S Park
*Assistant Examiner* — Paulo Andres Garcia
(74) *Attorney, Agent, or Firm* — Armstrong Teasdale LLP

(57)          ABSTRACT

A computer-implemented method of reducing artifacts in multi-channel magnetic resonance (MR) images is provided. The method includes receiving a plurality of sets of MR images acquired by a radio-frequency (RF) coil assembly having a plurality of channels. Each set of MR images includes a plurality of slices of MR images acquired by one of the plurality of channels. The method also includes estimating a plurality of sets of artifacts in the plurality of sets of MR images by inputting the plurality of sets of MR images into a neural network model. Each set of artifacts corresponds to the one of the plurality of channels. The method further includes reducing artifacts in the plurality of sets of MR images based on estimated artifacts, deriving MR images of reduced artifacts by combining the MR images of reduced artifacts, and outputting the MR images of reduced artifacts.

20 Claims, 12 Drawing Sheets

(51) Int. Cl.
    *G06T 5/73*           (2024.01)
    *G06T 7/00*           (2017.01)
(52) U.S. Cl.
    CPC .............. *G06T 2207/10088* (2013.01); *G06T 2207/20084* (2013.01); *G06T 2207/30096* (2013.01)
(58) Field of Classification Search
    CPC .... G06T 5/50; G06T 5/73; G06T 5/60; G06T 5/70; G06T 7/0012; G06T 2207/10088; G06T 2207/20084; G06T 2207/30096; G06T 2207/20081; A61B 5/055
    See application file for complete search history.

(56)            References Cited

U.S. PATENT DOCUMENTS

2023/0122658 A1*   4/2023   Kamilov ............ G01R 33/5608
                            382/131
2023/0342886 A1*   10/2023   Meyer ....................... G06T 5/70

OTHER PUBLICATIONS

Jiang, D., Dou, W., Vosters, L. et al. Denoising of 3D magnetic resonance images with multi-channel residual learning of convolutional neural network. Jpn J Radiol 36, 566-574 (2018). https://doi.org/10.1007/s11604-018-0758-8 (Year: 2018).*

R. Souza, M. Bento, N. Nogovitsyn, K. J. Chung, W. Loos, R. M. Lebel, R. Frayne, Dual-domain cascade of U-nets for multi-channel magnetic resonance image reconstruction, Magnetic Resonance Imaging, vol. 71, 2020, p. 140-153, ISSN 0730-725X, https://doi.org/10.1016/j.mri.2020.06.002 (Year: 2020).*

Grimm, Robert & Hutter, Jana & Kiefer, Berthold & Hornegger, J & Block, T. (2013). Fast Automatic Coil Selection for Radial Stack-of-stars GRE Imaging, https://archive.ismrm.org/2013/3786.html (Year: 2013).*

Retrieved from ResearchGate Sep. 6, 2025, https://www.researchgate.net/profile/Sheryl-Foster/post/MRI_MRS_users_what_is_your_opinion_the_best_machine_3T/attachment/59d62647c49f478072e9ae04/AS%3A272177574678540%401441903598464/download/GE_3T+data+sheet+Discovery+750.pdf (Year: 2009).*

Chang Gao et al., Undersampling artifact reduction for free-breathing 3D stack-of-radial MRI based on a deep adversarial learning network, Magnetic Resonance Imaging, vol. 95, 2023, p. 70-79, ISSN 0730-725X, https://doi.org/10.1016/j.mri.2022.10.010. (Year: 2023).*

Han Y, Yoo J, Kim HH, Shin HJ, Sung K, Ye JC. Deep learning with domain adaptation for accelerated projection-reconstruction MR. Magn Reson Med. 2018; 80: 1189-1205. https://doi.org/10.1002/mrm.27106 (Year: 2018).*

Feng, L., Huang, C., Shanbhogue, K., Sodickson, D.K., Chandarana, H. and Otazo, R. (2018), RACER-GRASP: Respiratory-weighted, aortic contrast enhancement-guided and coil-unstreaking golden-angle radial sparse MRI. Magn. Reson. Med, 80: 77-89. https://doi.org/10.1002/mrm.27002 (Year: 2018).*

Xue, Yiqun, et al. "Automatic coil selection for streak artifact reduction in radial MRI." Magnetic resonance in medicine 67.2 (2012): 470-476.

Holme, H. Christian M., and Jens Frahm. "Sinogram-based coil selection for streak artifact reduction in undersampled radial real-time magnetic resonance imaging." Quantitative imaging in medicine and surgery 6.5 (2016): 552.

Fu, Zhiyang, Maria I. Altbach, and Ali Bilgin. "Cancellation of streak artifacts using the interference null space (CACTUS) for radial abdominal imaging." Proceedings of the International Society of Magnetic Resonance in Medicine (ISMRM). 2021.

Blaimer et al. "Virtual Coil Concept for Improved Parallel MRI Employing Conjugate Symmetric Signals." Magneic Resonance in Medicine 61:93-102 (2009).

Mandava, Sagar, et al. "Radial streak artifact reduction using phased array beamforming." Magnetic resonance in medicine 81.6 (2019): 3915-3923.

\* cited by examiner

SYSTEMS AND METHODS OF ARTIFACT REDUCTION IN MAGNETIC RESONANCE IMAGES

BACKGROUND

The field of the disclosure relates generally to systems and methods of medical imaging, and more particularly, to systems and methods of artifact reduction in magnetic resonance (MR) images.

Magnetic resonance imaging (MRI) has proven useful in diagnosis of many diseases. MRI provides detailed images of soft tissues, abnormal tissues such as tumors, and other structures, which cannot be readily imaged by other imaging modalities like computed tomography (CT). Further, MRI operates without exposing patients to ionizing radiation experienced in modalities such as CT and x-rays.

Artifacts in MR images affect image quality of the images and may interfere with diagnosis. Known methods are disadvantaged in some aspects and improvements are desired.

BRIEF DESCRIPTION

In one aspect, a computer-implemented method of reducing artifacts in multi-channel magnetic resonance (MR) images is provided. The method includes receiving a plurality of sets of MR images of a volume in a subject. The plurality of sets of MR images are acquired by a radio-frequency (RF) coil assembly having a plurality of channels, and each set of MR images includes a plurality of slices of MR images of the volume acquired by one of the plurality of channels. The method also includes estimating a plurality of sets of artifacts in the plurality of sets of MR images by inputting the plurality of sets of MR images into a neural network model, wherein the neural network model is configured to estimate artifacts in an MR image inputted into the neural network model. Each set of artifacts corresponds to the one of the plurality of channels. The method further includes reducing artifacts in the plurality of sets of MR images based on the plurality of sets of estimated artifacts, deriving MR images of reduced artifacts by combining the plurality of sets of MR images of reduced artifacts, and outputting the MR images of reduced artifacts.

In another aspect, a computer-implemented method of reducing artifacts in MR images is provided. The method includes receiving one or more sets of MR images of a volume in a subject. The one or more sets of MR images are acquired by an RF coil assembly having one or more channels, and each set of MR images includes a plurality of slices of MR images of the volume acquired by one of the one or more channels. The method further includes estimating one or more sets of artifacts in the one or more sets of MR images by inputting the one or more sets of MR images into a neural network model, wherein the neural network model is configured to estimate artifacts in an MR image inputted into the neural network model. Each set of artifacts corresponds to the one of the one or more channels. The method further includes outputting the one or more sets of estimated artifacts.

In one more aspect, a computer-implemented method of reducing artifacts in multi-channel MR images is provided. The method includes receiving a plurality of sets of first MR images of a volume in a subject, wherein the plurality of sets of first MR images are acquired by an RF coil assembly having a plurality of channels. The method also includes reducing artifacts in the plurality of sets of first MR images based on a plurality of sets of estimated artifacts. The plurality of sets of estimated artifacts are estimated by inputting a plurality of sets of second MR images into a neural network model, wherein the neural network model is configured to estimate artifacts in an MR image inputted into the neural network model. The plurality of sets of second MR images are MR images of the volume acquired by the RF coil assembly. Each set of artifacts corresponds to the one of the plurality of channels. The method further includes deriving first MR images of reduced artifacts by combining the plurality of sets of first MR images of reduced artifacts, and outputting the first MR images of reduced artifacts.

DRAWINGS

DETAILED DESCRIPTION

The disclosure includes systems and methods of reducing artifacts in magnetic resonance (MR) images of a subject. As used herein, a subject is a human, an animal, or a phantom, or part of a human, an animal, or a phantom, such as an organ or tissue. Artifacts are visual anomalies in medical images that do not represent the anatomies or functions of the subject, unlike image signals which represent the anatomies and functions of the subject. The artifacts reduced using systems and methods described herein are channel dependent, where artifacts are more prominent in images acquired by some channels of an radio-frequency (RF) coil assembly of an MR system than other channels of the RF coil assembly. Reducing or removing artifacts is collectively referred to as reducing artifacts. Method aspects will be in part apparent and in part explicitly discussed in the following description.

In magnetic resonance imaging (MRI), a subject is placed in a magnet. When the subject is in the magnetic field generated by the magnet, magnetic moments of nuclei, such as protons, attempt to align with the magnetic field but precess about the magnetic field in a random order at the nuclei's Larmor frequency. The magnetic field of the magnet is referred to as $B_0$ and extends in the longitudinal or z direction. In acquiring an MRI image, a magnetic field (referred to as an excitation field B$_1$), which is in the x-y plane and near the Larmor frequency, is generated by a radio-frequency (RF) coil and may be used to rotate, or "tip," the net magnetic moment Mz of the nuclei from the z direction to the transverse or x-y plane. A signal, which is referred to as an MR signal, is emitted by the nuclei, after the excitation signal B$_1$ is terminated. To use the MR signals to generate an image of a subject, magnetic field gradient pulses (Gx, Gy, and Gz) are used. The gradient pulses are used to scan through the k-space, the space of spatial frequencies or inverse of distances. A Fourier relationship exists between the acquired MR signals and an image of the subject, and therefore the image of the subject can be derived by reconstructing the MR signals.

Figure 1:
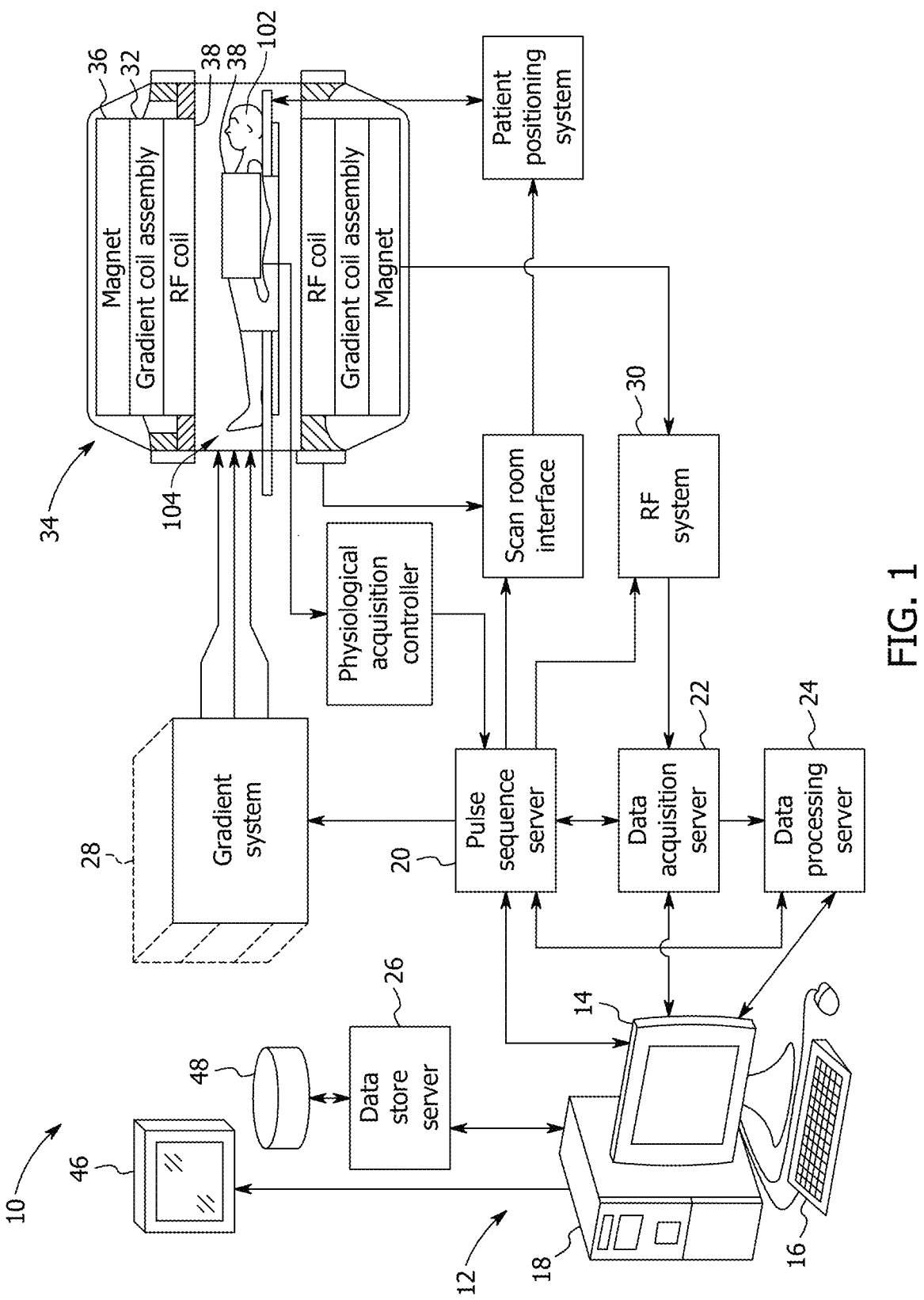
FIG. 1 is a schematic diagram of an example magnetic resonance imaging (MRI) system.

FIG. 1 illustrates a schematic diagram of an example MRI system 10. In the example embodiment, MRI system 10 includes a workstation 12 having a display 14 and a keyboard 16. Workstation 12 includes a processor 18, such as a commercially available programmable machine running a commercially available operating system. Workstation 12 provides an operator interface that allows scan prescriptions to be entered into MRI system 10. Workstation 12 is coupled to a pulse sequence server 20, a data acquisition server 22, a data processing server 24, and a data store server 26. Workstation 12 and each server 20, 22, 24, and 26 communicate with each other.

In the example embodiment, pulse sequence server 20 responds to instructions downloaded from workstation 12 to operate a gradient system 28 and a radiofrequency ("RF") system 30. The instructions are used to produce gradient and RF waveforms in MR pulse sequences. An RF coil 38 and a gradient coil assembly 32 are used to perform the prescribed MR pulse sequence. RF coil 38 is shown as a whole body RF coil. RF coil 38 may also be a local coil that may be placed in proximity to the anatomy to be imaged, or a coil array that includes a plurality of coils.

In the example embodiment, gradient waveforms used to perform the prescribed scan are produced and applied to gradient system 28, which excites gradient coils in gradient coil assembly 32 to produce the magnetic field gradients G$_x$, G$_y$, and G$_z$ used for position-encoding MR signals. Gradient coil assembly 32 forms part of a magnet assembly 34 that also includes a polarizing magnet 36 and RF coil 38.

In the example embodiment, RF system 30 includes an RF transmitter for producing RF pulses used in MR pulse sequences. The RF transmitter is responsive to the scan prescription and direction from pulse sequence server 20 to produce RF pulses of a desired frequency, phase, and pulse amplitude waveform. The generated RF pulses may be applied to RF coil 38 by RF system 30. Responsive MR signals detected by RF coil 38 are received by RF system 30, amplified, demodulated, filtered, and digitized under direction of commands produced by pulse sequence server 20. RF coil 38 is described as a transmit and receive coil such that RF coil 38 transmits RF pulses and detects MR signals. In one embodiment, MRI system 10 may include a transmit RF coil that transmits RF pulses and a separate receive coil that detects MR signals. A transmission channel of RF system 30 may be connected to a RF transmission coil and a receiver channel may be connected to a separate RF receive coil. Often, the transmission channel is connected to the whole body RF coil 38 and each receiver section is connected to a separate local RF coil.

In the example embodiment, RF system 30 also includes one or more RF receiver channels. Each RF receiver channel includes an RF amplifier that amplifies the MR signal received by RF coil 38 to which the channel is connected, and a detector that detects and digitizes the I and $Q$ quadrature components of the received MR signal. The magnitude of the received MR signal may then be determined as the square root of the sum of the squares of the I and $Q$ components as in Eq. (1) below:

$$M = \sqrt{I^2 + Q^2}\,;\tag{1}$$

and the phase of the received MR signal may also be determined as in Eq. (2) below:

$$\varphi = \tan^{-1}\!\left(\frac{Q}{I}\right).\tag{2}$$

In the example embodiment, the digitized MR signal samples produced by RF system 30 are received by data acquisition server 22. Data acquisition server 22 may operate in response to instructions downloaded from workstation 12 to receive real-time MR data and provide buffer storage such that no data is lost by data overrun. In some scans, data acquisition server 22 does little more than pass the acquired MR data to data processing server 24. In scans that need information derived from acquired MR data to control further performance of the scan, however, data acquisition server 22 is programmed to produce the needed information and convey it to pulse sequence server 20. For example, during prescans, MR data is acquired and used to calibrate the pulse sequence performed by pulse sequence server 20. Also, navigator signals may be acquired during a scan and used to adjust the operating parameters of RF system 30 or gradient system 28, or to control the view order in which k-space is sampled.

In the example embodiment, data processing server 24 receives MR data from data acquisition server 22 and processes it in accordance with instructions downloaded from workstation 12. Such processing may include, for example, Fourier transformation of raw k-space MR data to produce two or three-dimensional images, the application of filters to a reconstructed image, the performance of a back-projection image reconstruction of acquired MR data, the generation of functional MR images, and the calculation of motion or flow images.

In the example embodiment, images reconstructed by data processing server 24 are conveyed back to, and stored at, workstation 12. In some embodiments, real-time images are stored in a database memory cache (not shown in FIG. 1), from which they may be output to operator display 14 or a display 46 that is located near magnet assembly 34 for use by attending physicians. Batch mode images or selected real time images may be stored in a host database on disc storage 48 or on a cloud. When such images have been reconstructed and transferred to storage, data processing server 24 notifies data store server 26. Workstation 12 may be used by an operator to archive the images, produce films, or send the images via a network to other facilities.

Figure 2:
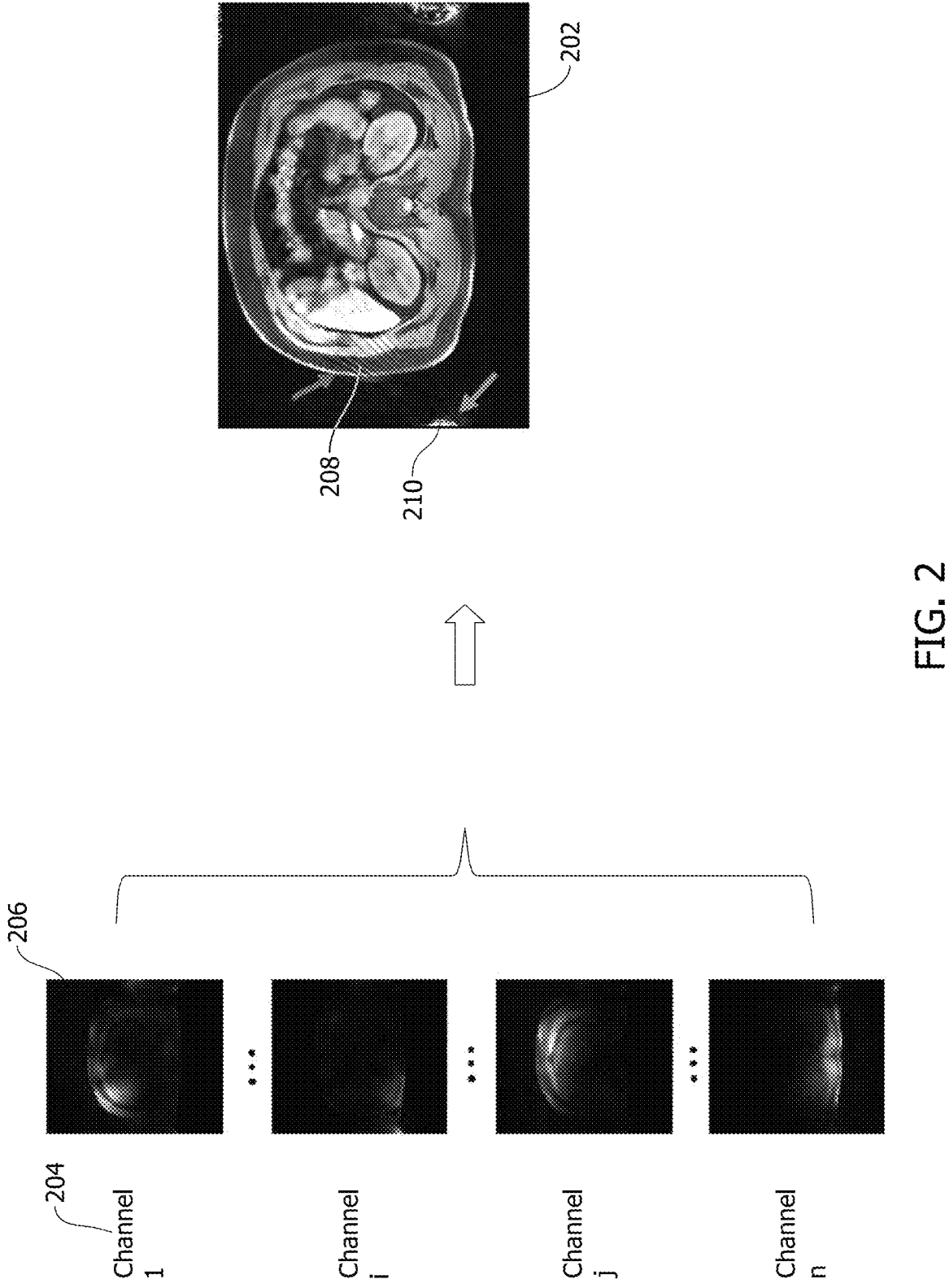
FIG. 2 is a schematic diagram showing combination of images acquired by channels of a radio-frequency (RF) coil assembly.

FIG. 2 shows formation of an MR image 202 from MR signals acquired by a multi-channel RF coil assembly 38. RF coil assembly 38 is a local RF coil. A multi-channel RF coil assembly includes multiple coils and multiple channels. One channel may correspond to one or multiple coils. MR signals acquired by a channel 204 are used to reconstruct an MR image corresponding to that channel 204. As used herein, a channel may include physical coils and/or virtual coils. Signals from a virtual coil are generated based on signals acquired by a physical coil. For example, signals $S_{virtual}$ from a virtual coil may be conjugate symmetric signals of k-space signals $S^{physical}$ from the physical coil, as expressed in the below equation.

$$S_{virtual}(k) = S^*_{physical}(-k), \qquad (3)$$

where * denotes a complex conjugate and k denotes a location in the k-space. The MR image corresponding to a specific channel may referred to as a channel image. When RF coil assembly 38 is placed proximate to subject 102 (see FIG. 1), a coil may be proximate to certain anatomy of the subject than other coils. As a result, although images 206 of individual channels 204 or channel images 206 are abdominal images of the same slice of the subject, channel images 206 are different for different channels. The output image 202 is the combined image of channel images 206.

Radial acquisitions, such as stack of stars or PROPELLER (Periodically Rotated Overlapping ParallEL Lines with Enhanced Reconstruction) are attractive in MR imaging such as free-breathing MR imaging because radial acquisitions are relatively insensitive to motion. In radial or PROPELLER imaging, the k-space is sampled along radial lines. Radial acquisitions, however, suffers from streak artifacts, compromising image and diagnostic quality. In FIG. 2, the images are acquired with radial acquisition. Output image 202 includes streak artifacts 208. Streak artifacts are more prominent in the arms-down position than the arms-up position because streak artifacts are caused by aliasing of relatively bright signals from anatomies outside the field of view (FOV), e.g., an arm 210, due to field inhomogeneity, high receiver sensitivity, gradient non-linearity, transient motion, and incomplete fat suppression. For example, during imaging, arm 210 is close to the edge of a bore 104 (see FIG. 1) of magnet assembly 34 where the magnetic field is not as uniform as the center of bore 104. Further, because arm 210 is positioned close to RF coil assembly, the signal to noise ratio (SNR) from arm 210 is relatively high and signals from arm 210 are aliased into the FOV and produce artifacts 208. Because individual coils are at different spatial relationships with the anatomy being imaged, artifacts 208 are more prominent in some channels than other channels. Streak artifacts are used as examples for illustration purposes only. Systems and methods described herein may be applied to determine and reduce other artifacts such as annefacts, motion artifacts, and flow artifacts. Annefacts are caused by stimulated echoes of signals outside the FOV. Motion artifacts and flow artifacts are caused by motion or flow, respectively. Streak artifacts, annefacts, motion artifacts, and flow artifacts are channel dependent, where the artifacts are more prominent in some channels than other channels or some locations than other locations due to the spatial locations of the coil(s). For example, because some coils are more proximate to the artifact source than other coils, artifacts are more prominent in some coils/channels than other coils/channels. If RF coil assembly is single channeled, artifacts are more prominent at certain locations than other locations.

In a known method of removing channel-dependent artifacts, a low-pass filter is applied on the channel data and the differences between low-resolution and high-resolution channel images/sinograms are calculated. The differences are used to estimate artifacts in each channel. Channels having prominent artifacts in the channel data are removed during image reconstruction. The estimated artifacts, however, highly depend on the selection of the parameters of the low-pass filter. Applying low-pass filtering to estimate and reduce artifacts is based on the observation that streak artifacts have relatively high spatial frequencies. Edges in images also have relatively high spatial frequencies. The known method therefore skews the estimation of streak artifacts and erroneously removes or reduces image signals. Further, the differences between the low-resolution and high-resolution channel data include confounding signals, such as noise and truncation artifacts, which are not channel dependent, reducing the accuracy of estimation of channel-dependent artifacts. Further, low-pass filtering does not reduce other channel-dependent artifacts, such as motion artifacts or annefacts, because motion artifacts or annefacts do not necessarily have relatively high spatial frequencies. Other known methods of reducing streak artifacts do not address the channel dependency. Instead, the known methods attempt to identify a region of interest (ROI) that include the artifacts. Further the known methods need manual intervention to extract the ROI, increasing the complexity of workflow and reducing robustness of the known methods.

In known methods using a neural network model to reduce artifacts or noise, the artifacts or noise is not channel dependent. The images from different channels have already been combined before being analyzed by the neural network model. Accordingly, known methods using a neural network model are not suitable for removing channel dependent artifacts.

In contrast, in the systems and methods described herein increase the accuracy in estimating and reducing channel-dependent artifacts, thereby improving the diagnostic quality of images and robustness of non-Cartesian and Cartesian imaging. Systems and methods described herein do not rely on the assumption that the artifacts have relatively high spatial frequency, unlike the known method. Systems and methods described herein estimate and reduce artifacts using a neural network model trained to estimate channel-dependent artifacts. Systems and methods described herein are not limited to streak artifacts, and may be used to reduce other channel-dependent artifacts such as annefacts, motion artifacts, and flow artifact, thereby further improving image and diagnostic quality. Systems and methods described herein reduce artifacts that are relatively prominent in certain imaging positions such as the arms-down position, thereby relaxing the limitation of imaging positions. As a result, subject comfort and cooperation is increased, and the limit of scan time during imaging from uncomfortable positions is avoided. Systems and methods described herein enable free-breathing by reducing streak artifacts in radial acquisitions, thereby improving imaging experience of the subject.

Figure 3A:
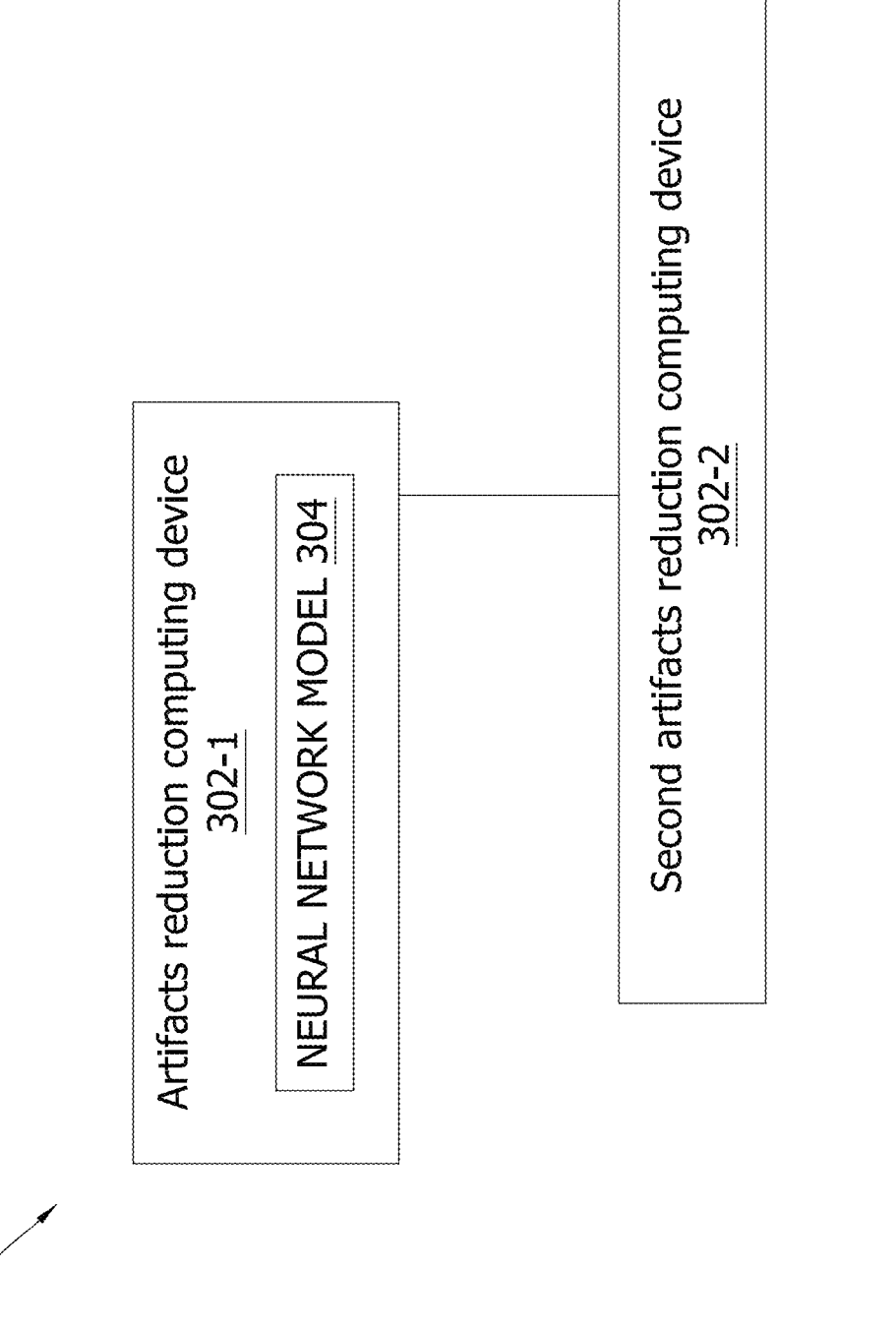
FIG. 3A is an example artifact reduction system.

FIG. 3A is a schematic diagram of an example artifact reduction system 300. In the example embodiment, system 300 includes an artifact reduction computing device 302-1 configured to reduce artifacts in an MR image. Computing device 302-1 further includes a neural network model 304. System 300 may include a second artifact reduction computing device 302-2. Second artifact reduction computing device 302-2 may be used to train neural network model 304, and artifact reduction computing device 302-1 may then use the trained neural network model 304. Second artifact reduction computing device 302-2 may be the same artifact reduction computing device as artifact reduction computing device 302-1 such that the training and use of neural network model 304 are on one computing device. Alternatively, second artifact reduction computing device 302-2 may be a computing device separate from artifact reduction computing device 302-1 such that the training and use of neural network model 304 are executed on separate computing devices. Artifacts reduction computing device 302 may be included in workstation 12 of MRI system 10, or may be included on a separate computing device that is in communication with workstation 12. In one example, artifact reduction computing device 302 is a server computing device, and may be cloud-based.

In the example embodiments, neural network model 304 may be trained by computer generated training images. The training images may include natural images and computer generated natural images with streak artifacts. For example, in generating computer simulated training images, the natural images are enhanced at random regions. The randomly enhanced natural images are simulated with radial acquisitions to generate k-space data. Images with streak artifacts are generated after reconstructing the simulated k-space data. As being trained with the computer generated training images, neural network model 304 is trained to recognize and estimate streak artifacts in the input images to neural network model 304. Training images with other channel-dependent artifacts may be similarly computer generated based on the causes of the channel-dependent artifacts. For example, motion artifacts may be generated by generating k-space data using a selected acquisition, a Cartesian or non-Cartesian acquisition, introducing motion during the computer simulated acquisition, and reconstructing the simulated k-space data with motion to generate natural images with motion artifacts.

Figure 3B:
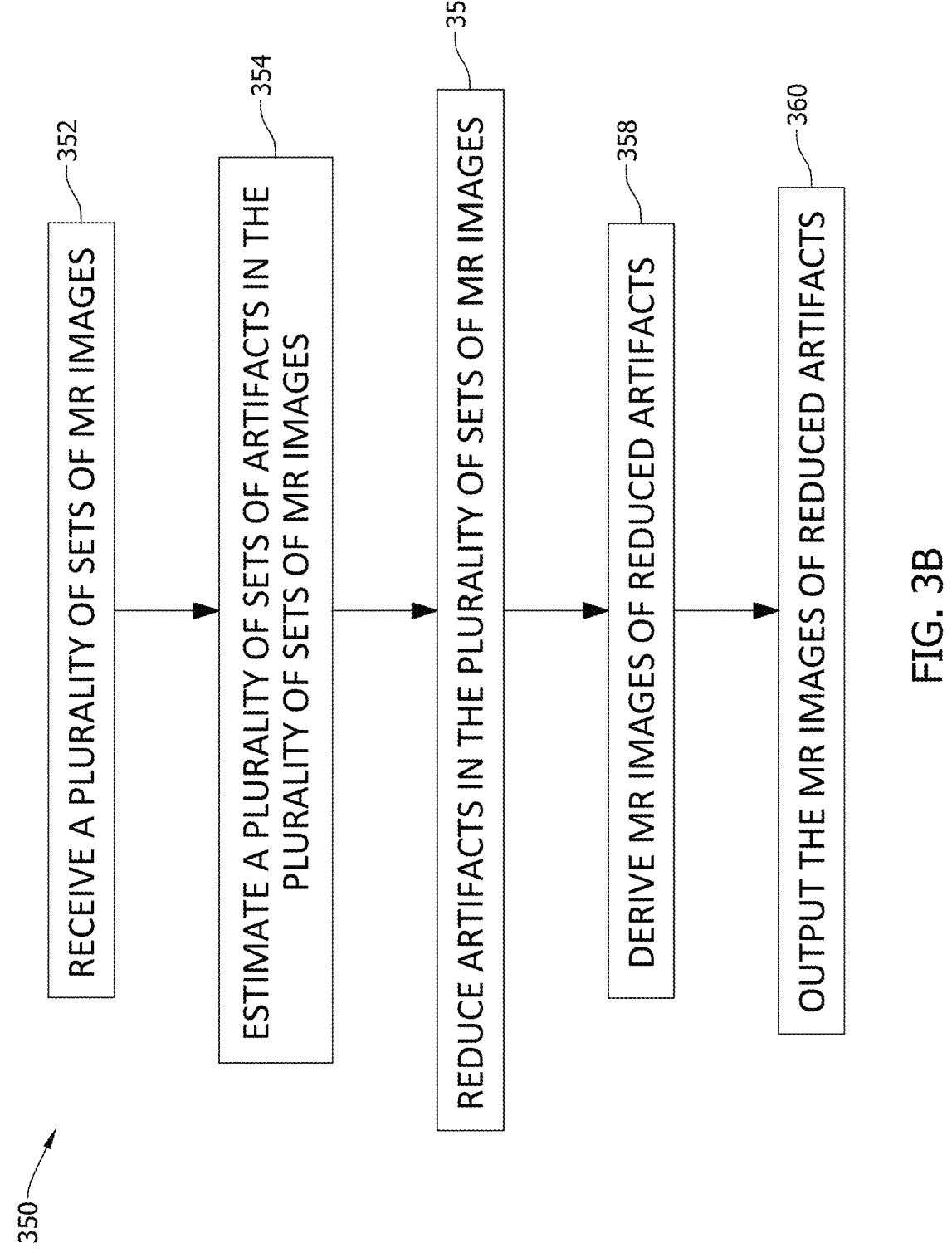
FIG. 3B is a flow chart of an example method of reducing artifacts.

FIG. 3B is a flow chart of an example method 350. Method 350 may be implemented on artifact reduction system 300. In the example embodiment, method 350 includes receiving 352 sets of MR images of a volume in a subject 102 (see FIG. 1). The sets of MR images are acquired by RF coil assembly 38. RF coil assembly 38 includes one or more channels. Each set of MR images corresponds to a channel, where the set of MR images are acquired by that channel. For example, if RF coil assembly 38 includes 120 channels. 120 sets of MR images are acquired. Each set corresponds to one of the 120 channels, where each set includes MR images acquired by the one of the 120 channels of the same volume in subject 102. The volume is covered by one or more slices. An example volume is a three-dimensional (3D) abdominal region. A set of MR images are slices of MR images of the volume acquired by a channel.

In the example embodiments, method 350 further includes estimating 354 sets of artifacts in the sets of MR images. Each set of artifacts includes the artifacts in the set of MR images of an individual channel, and corresponds to the individual channel. Artifacts may be estimated by inputting the sets of MR images into a neural network model 304. Neural network model 304 is configured to estimate artifacts in an MR image inputted to neural network model 304. As a result, neural network model 304 estimates a set of artifacts in a set of MR images, where the set of artifacts corresponds to the channel that acquires the set of MR images. For example, if 120 sets of abdominal MR images are inputted into neural network model 304. Neural network model 304 is configured to estimate 120 sets of artifacts in each of the 120 sets of abdominal MR images. Each set of artifacts corresponds to artifacts in the abdominal MR images acquired by one of the 120 channels. Some channels may have more prominent artifacts than other channels. Method 350 also includes reducing 356 artifacts in the sets of MR images based on the sets of estimated artifacts.

Channels having relatively prominent artifacts may be discarded or weighted down in image reconstruction to reduce artifacts in the final images.

In the example embodiment, method 350 includes deriving 358 MR images of reduced artifacts by combining the sets of MR images of reduced artifacts. The MR images of reduced artifacts may be combined by adding the sets of MR images of reduced artifacts and dividing the sum by the number of sets. Unlike other imaging modalities, MRI is unique in that an MRI signal is represented by a complex number, rather than a scalar or a real number. The image value for each image pixel includes a magnitude and a phase. The combination is performed on complex numbers. For example, the addition of the sets of MR images is addition of complex numbers. Division of the sum by the number of sets is division of the complex numbers by the number of sets. For example, for 100 sets of MR images of reduced artifacts, the combined MR images are derived by combining 100 complex numbers for each pixel in the volume. In addition, method 350 includes outputting 360 the MR images of reduced artifacts.

Figure 4:
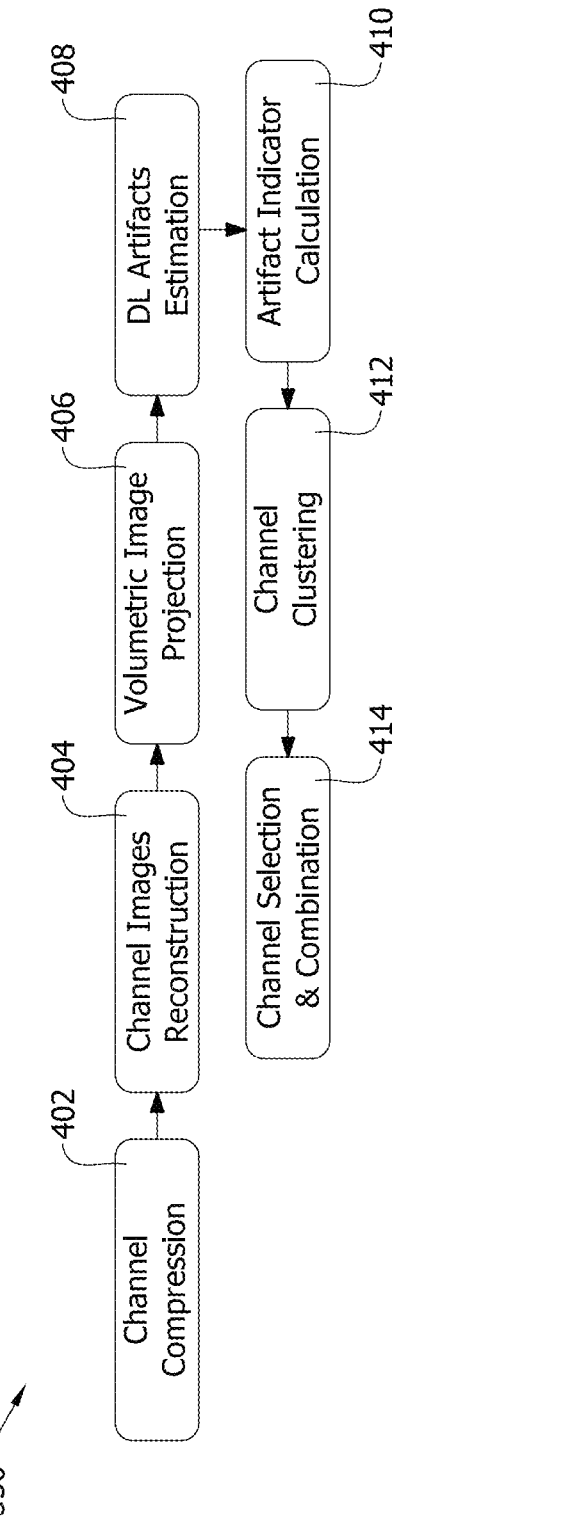
FIG. 4 is a schematic diagram illustrating the work flow of an example embodiment of the method shown in FIG. 3B.

FIG. 4 shows an example work flow of method 350. In the example embodiment, images of a volume in subject 102 are acquired. Channels may be compressed 402 to reduce the amount data to be processed. For example, 120 channels may be compressed to 100 channels. The channel images are reconstructed 404. Each channel has one set of images of the volume. The volume is covered by slices of images. For example, if the volume includes 50 slices. The set of MR images corresponding to one of the channels includes 50 slices of MR images. The total number of sets are the total number of channels, depending on whether the channels have been compressed. For example, if channels are not compressed, in the above example, 120 sets of images of the volume are reconstructed. If channels are compressed, 100 sets of images of the volume are reconstructed.

In the example embodiments, the sets of MR images are projected 406 along the slice direction. Projecting the sets of MR images along the slice direction may be referred to as volumetric projection. Sets of MR images may be represented as sets of 3D images of complex numbers at $(x, y, z)$ locations, where z is the slice direction and represents the slice location in the slice direction, and $(x, y)$ is the location in the transverse plane perpendicular to the slide direction. Projection may be a weighted combination of images along the slice direction, where image values of a pixel at $(x, y)$ of all slices z are combined with weightings for the slices z. In one example, projection may be addition of images along the slice direction, where the image values of a pixel at $(x, y)$ of all slices z are added. Alternatively, projection is maximum intensity projection, where a pixel at $(x, y)$ having the maximum intensity, such as the maximum magnitude, among all slice locations z is chosen to represent the image value for the pixel at $(x, y)$ in the projected image. Following the above example, 100 sets of images of an abdominal volume of 50 slices are provided. The slice direction is superior-inferior. The transverse plane is axial. Each set includes 50 axial images, arranged in the superior-inferior direction. z is the slice location in the superior-inferior direction. $(x, y)$ is the location in the transverse plane. Volumetric projection on the 100 sets of abdominal images is performed along the superior-inferior direction by operating on 50 complex numbers for each $(x, y)$ position in the transverse plane, depending on the algorithm chosen for the volumetric projection.

Volumetric projection is advantageous in reducing the amount of data to be inputted into neural network model 304 and reducing the number of inferences needed from neural network model 304. For example, if the number of slices is 50, the amount of data and the number of inferences needed are reduced by 50 times, greatly reducing computation load and increasing the computation speed. Volumetric projection is also advantageous in enhancing the accuracy in estimating artifacts because if present, artifacts tend to appear in multiple slices and volumetric projection preserves the artifacts and enhance the detection of artifacts while reducing signals and noise. Volumetric projection is optional, and may or may not performed on the sets of MR images before being inputted into neural network model 304.

In the example embodiments, sets of images are inputted into neural network model 304 and artifacts are estimated 408 by neural network model 304. Artifact indicators may be calculated 410. Channels are clustered 412 based on the artifact indicators. Clusters with relatively low artifact indicators, along with channels in the clusters, are selected 414 and images of the selected channels are combined. As a result, images of reduced artifacts are generated.

Figure 5:
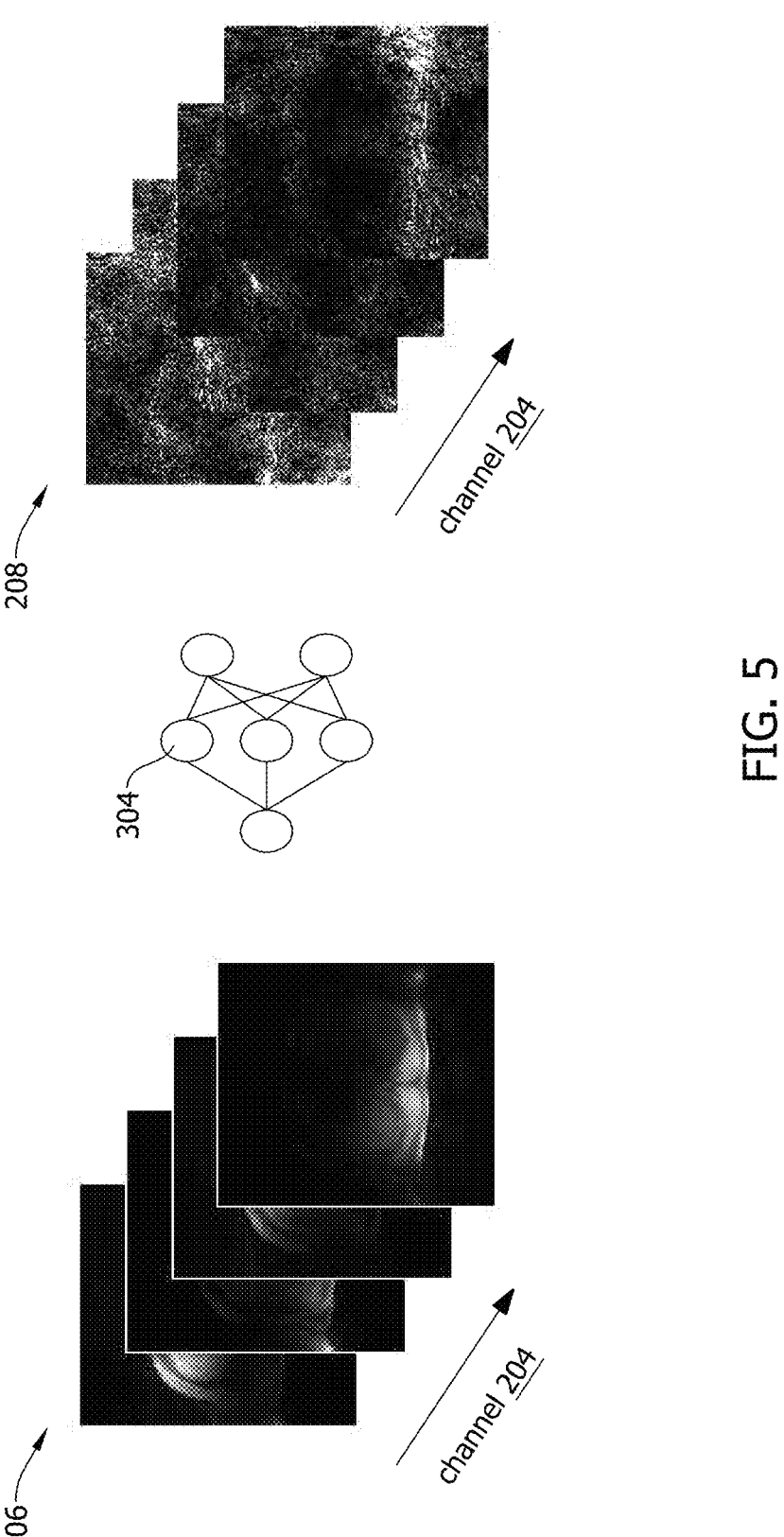
FIG. 5 is a schematic diagram showing that a neural network model is used to estimate artifacts.

FIG. 5 is a schematic diagram showing the use of a neural network model to estimate artifacts. In the example embodiments, channel images 206 of the same slice acquired by different channels 204 are inputted into neural network model 304. Neural network model 304 estimates artifacts 208 in channel images 206 and outputs artifacts in the slice of different channels 204. Artifacts are presented as an image of artifacts for that slice for individual channels 204. If volumetric projection is performed, inputs are projected images 206 of different channels 204, and each output image of artifacts 208 corresponds to the artifacts in projected image 206 of that channel 204.

Figures 6A, 6B:
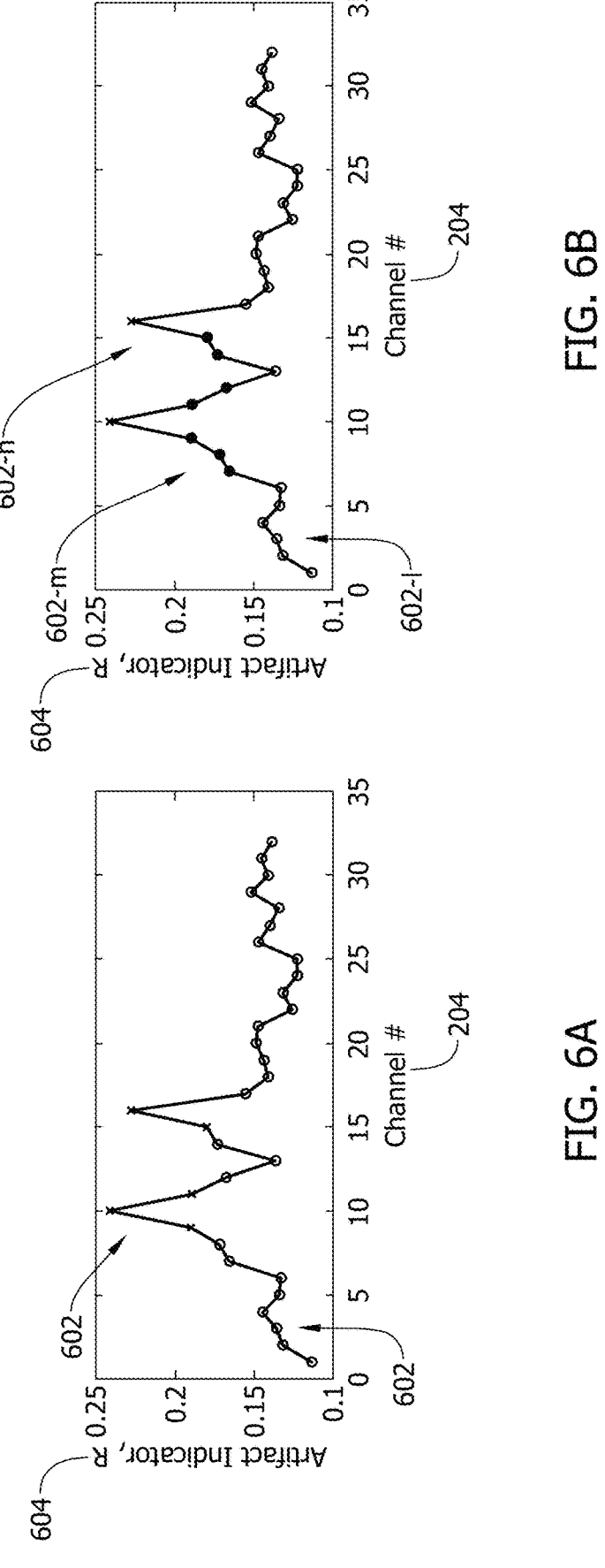
FIG. 6A is a plot of artifact indicators of the channels having two clusters.
FIG. 6B is a plot of artifact indicators of the channels having three clusters.

FIGS. 6A and 6B show plots of artifact indicators. In the example embodiment, an artifact indicator is determined as the ratio between the artifacts and images of reduced artifacts or channel images of reduced artifacts. Channel images of reduced artifacts ($I_{res}$) serve as the normalizers and are derived by subtracting the estimated artifacts ($I_{artifacts}$) from the projected channel images or the original channel images. Channel images $I_{channel}$ are the set of images acquired by a certain channel before the artifact reduction. The subtraction is performed on complex numbers. Artifact indicator R is determined for each channel and denotes the level of artifacts in images acquired by that channel. Artifact indicator R may be calculated as a ratio between the image intensity ($\|I_{artifacts}\|$) of the artifacts and the image intensity of the images of reduced artifacts ($\|I_{ref}\|$). e.g., $R=\|I_{artifacts}\|/\|I_{ref}\|$. Image intensity may be calculated as the sum of magintue values of individual pixels in the image. Alternatively, an artifact indicator may be the image intensity ($\|I_{artifacts}\|$) of the artifacts.

In the example embodiment, channels may be clustered based on artifact indicators. The number of clusters may be 2, or may be other numbers such as ten. Two clusters are used in FIG. 6A, and three clusters are used in FIG. 6B. Channels having a relatively high level of artifacts may be discarded from reconstruction of the final image, while channels having a relatively moderate or low level of artifacts are selected. A weighting may be applied to the clusters. Different weighting may be applied to different clusters. For example, in FIG. 6B, channels in cluster 602-*h*, which has the highest level of artifacts among the clusters 602, are discarded during image reconstruction, or applied with a weighting of zero. Channels in cluster 602-*m*, which has a moderate level of artifacts, are weighted with a weighting of 0.5. Channels in cluster 602-1, which has a relatively low level of artifacts, are weighted with a weighting of 1. As a result, images from channels having a relatively high level of artifacts are discarded, and image values from channels having a moderate level of artifacts are reduced while images from channels having a relatively low level of artifacts are preserved. In some embodiments, weighting may be inversely proportional to artifact indicators 604. The selected or weighted images are combined to produce the final image, thereby reducing the artifacts in the final image.

In some embodiments, the selection and combination of channels is determined by collective factors, such as artifact indicators, overall signal intensity in channel images, and/or intensity distribution such as whether signals are distributed uniformly across the images or being localized. The image intensity and/or intensity distribution may be used to adjust the clustering and weighting, like the number of clustering and weighting for each cluster. For example, if the overall signal intensity is low, the number of clusters may be reduced and the weighting may be increased to maintain the level of signal intensity. In another example, if the signal distribution across the images is relatively uniform, the number of clusters may be reduced.

Referring back to FIG. 5, in some embodiments, neural network model 304 is configured to output artifact indicators 604 for each channel. One or more additional layers 504 (see FIGS. 8A and 8B described later) are included in neural network model 304 and are configured to determine artifact indicators 604 based on artifacts 208, using systems and methods as described above.

Figure 7:
FIG. 7 is a comparison of images reconstructed with and without using the systems and methods described herein.

FIG. 7 is a comparison of an image 702-*wo* reconstructed without using systems and methods described herein and an image 702-*w* of the same slice using systems and methods described herein. Artifacts 208 are greatly reduced in image 702-*w*, compared to image 702-*wo* (see the areas pointed by an arrow 703).

Systems and methods described herein may be used to remove channels or reduce signals acquired by those channels that have relatively high level of artifacts in the images. Systems and methods described herein may be used to estimate and identify artifacts in the images. For example, if a single-channel RF coil assembly 38 is used, the images acquired by single-channel RF coil assembly 38 may be inputted into neural network model 304. Neural network model 304 outputs artifacts in the images. Artifact indicators may be determined based on the output artifacts as described above. Artifact indicators may be determined by neural network model 304 or outside neural network model 304. A user may be informed with the level of artifacts in the images, based on the output artifacts or artifact indicators.

In some embodiments, artifact reduction may be performed on images from one imaging series using artifacts estimated based on images from a different imaging series of the same volume. For example, a calibration imaging series or localization imaging series is performed during prescan. The calibration and/or location data may be used to estimate artifacts. The estimated artifacts are used to reduce artifacts in images later acquired using the same types of pulse sequences. For example, if the calibration imaging series and the later imaging series are both acquired with a fast spin echo (FSE) pulse sequence. The artifacts estimated with the calibration imaging series may be used to reduce artifacts in the later imaging series.

Figure 8A:
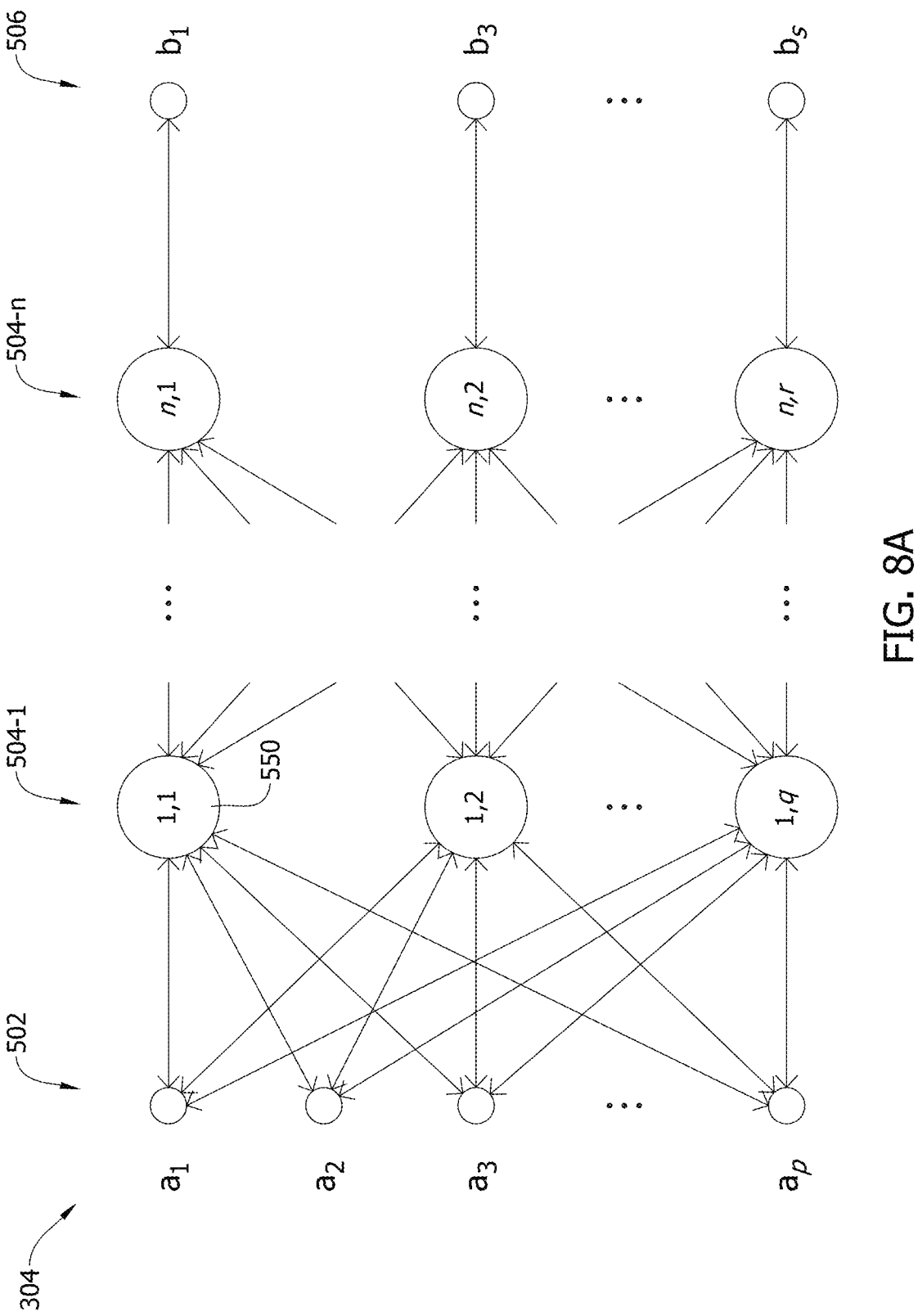
FIG. 8A is a schematic diagram of a neural network model.

FIG. 8A depicts an example artificial neural network model 304. The example neural network model 304 includes layers of neurons 502, 504-1 to 504-*n*, and 506, including an input layer 502, one or more hidden layers 504-1 through 504-*n*, and an output layer 506. Each layer may include any number of neurons, i.e., q, r, and n in FIG. 8A may be any positive integer. It should be understood that neural networks of a different structure and configuration from that depicted in FIG. 8A may be used to achieve the methods and systems described herein.

In the example embodiment, input layer 502 may receive different input data. For example, input layer 502 includes a first input $a_1$ representing training images, a second input $a_2$ representing patterns identified in the training images, a third input $a_3$ representing edges of the training images, and so on. Input layer 502 may include thousands or more inputs. In some embodiments, the number of elements used by neural network model 304 changes during the training process, and some neurons are bypassed or ignored if, for example, during execution of the neural network, they are determined to be of less relevance.

In the example embodiment, each neuron in hidden layer(s) 504-1 through 504-n processes one or more inputs from input layer 502, and/or one or more outputs from neurons in one of the previous hidden layers, to generate a decision or output. The output layer 506 includes one or more outputs each indicating a label, confidence factor, weight describing the inputs, and/or an output image. In some embodiments, however, outputs of neural network model 304 are obtained from a hidden layer 504-1 through 504-n in addition to, or in place of, output(s) from output layer(s) 506.

In some embodiments, each layer has a discrete, recognizable function with respect to input data. For example, if n is equal to 3, a first layer analyzes the first dimension of the inputs, a second layer the second dimension, and the final layer the third dimension of the inputs. Dimensions may correspond to aspects considered strongly determinative, then those considered of intermediate importance, and finally those of less relevance.

In other embodiments, the layers are not clearly delineated in terms of the functionality they perform. For example, two or more of hidden layers 504-1 through 504-n may share decisions relating to labeling, with no single layer making an independent decision as to labeling.

Figure 8B:
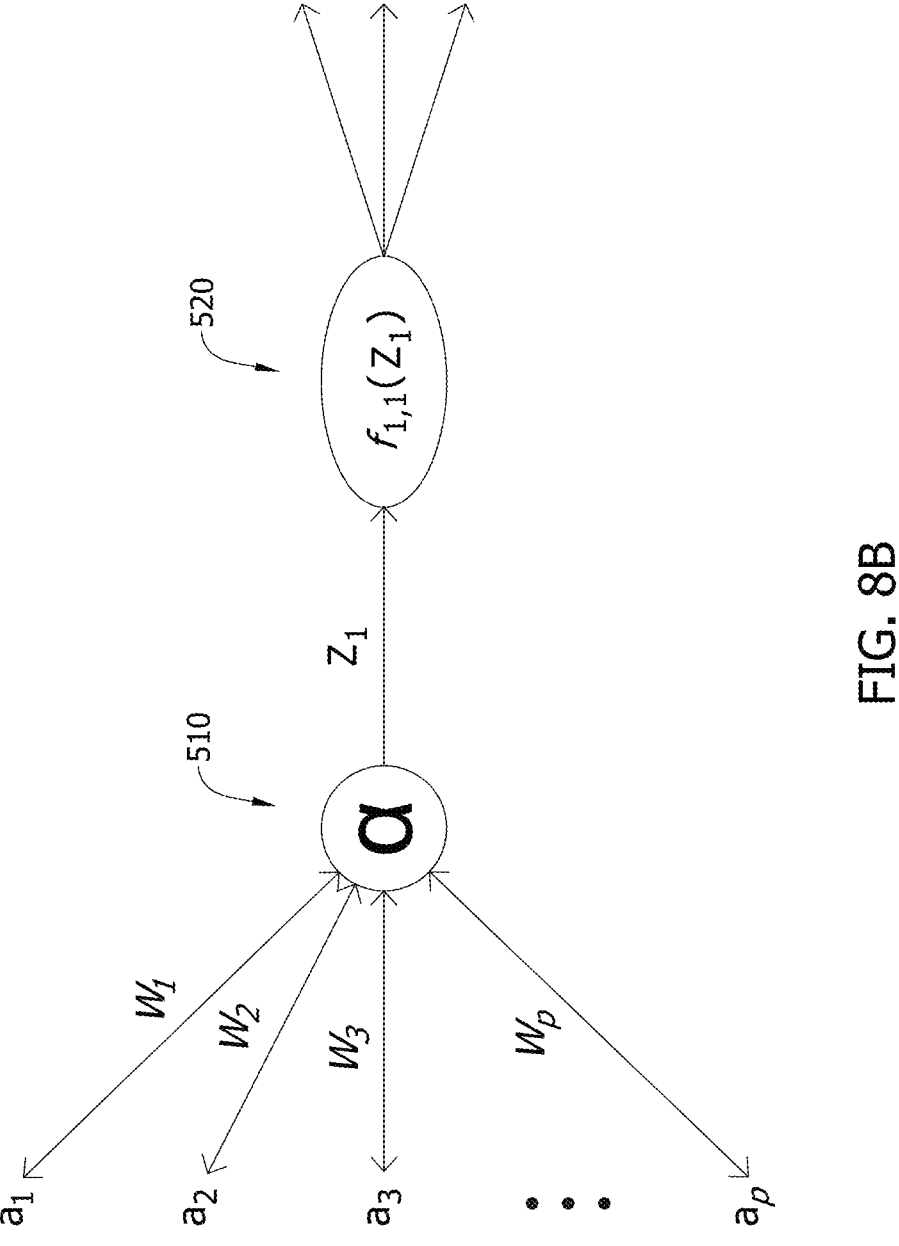
FIG. 8B is a schematic diagram of a neuron in the neural network model shown in FIG. 8A.

FIG. 8B depicts an example neuron 550 that corresponds to the neuron labeled as "1,1" in hidden layer 504-1 of FIG. 5A, according to one embodiment. Each of the inputs to neuron 550 (e.g., the inputs in input layer 502 in FIG. 8A) is weighted such that input $a_1$ through $a_p$ corresponds to weights $w_1$ through $w_p$ as determined during the training process of neural network model 304.

In some embodiments, some inputs lack an explicit weight, or have a weight below a threshold. The weights are applied to a function $\alpha$ (labeled by a reference numeral 510), which may be a summation and may produce a value $z_1$ which is inputted to a function 520, labeled as $f_{1,1}(z_1)$. Function 520 is any suitable linear or non-linear function. As depicted in FIG. 8B, function 520 produces multiple outputs, which may be provided to neuron(s) of a subsequent layer, or used as an output of neural network model 304. For example, the outputs may correspond to index values of a list of labels, or may be calculated values used as inputs to subsequent functions.

It should be appreciated that the structure and function of neural network model 304 and neuron 550 depicted are for illustration purposes only, and that other suitable configurations exist. For example, the output of any given neuron may depend not only on values determined by past neurons, but also on future neurons.

Neural network model 304 may include a convolutional neural network (CNN), a deep learning neural network, a reinforced or reinforcement learning module or program, or a combined learning module or program that learns in two or more fields or areas of interest. Supervised and unsupervised machine learning techniques may be used. In supervised machine learning, a processing element may be provided with example inputs and their associated outputs, and may seek to discover a general rule that maps inputs to outputs, so that when subsequent novel inputs are provided the processing element may, based upon the discovered rule, accurately predict the correct output. Neural network model 304 may be trained using unsupervised machine learning programs. In unsupervised machine learning, the processing element may be required to find its own structure in unlabeled example inputs. Machine learning may involve identifying and recognizing patterns in existing data in order to facilitate making predictions for subsequent data. Models may be created based upon example inputs in order to make valid and reliable predictions for novel inputs.

Additionally or alternatively, the machine learning programs may be trained by inputting sample data sets or certain data into the programs, such as images, object statistics, and information. The machine learning programs may use deep learning algorithms that may be primarily focused on pattern recognition, and may be trained after processing multiple examples. The machine learning programs may include Bayesian Program Learning (BPL), voice recognition and synthesis, image or object recognition, optical character recognition, and/or natural language processing-either individually or in combination. The machine learning programs may also include natural language processing, semantic analysis, automatic reasoning, and/or machine learning.

Based upon these analyses, the neural network model 304 may learn how to identify characteristics and patterns that may then be applied to analyzing image data, model data, and/or other data. For example, the model 304 may learn to identify features in a series of data points.

Figure 9:
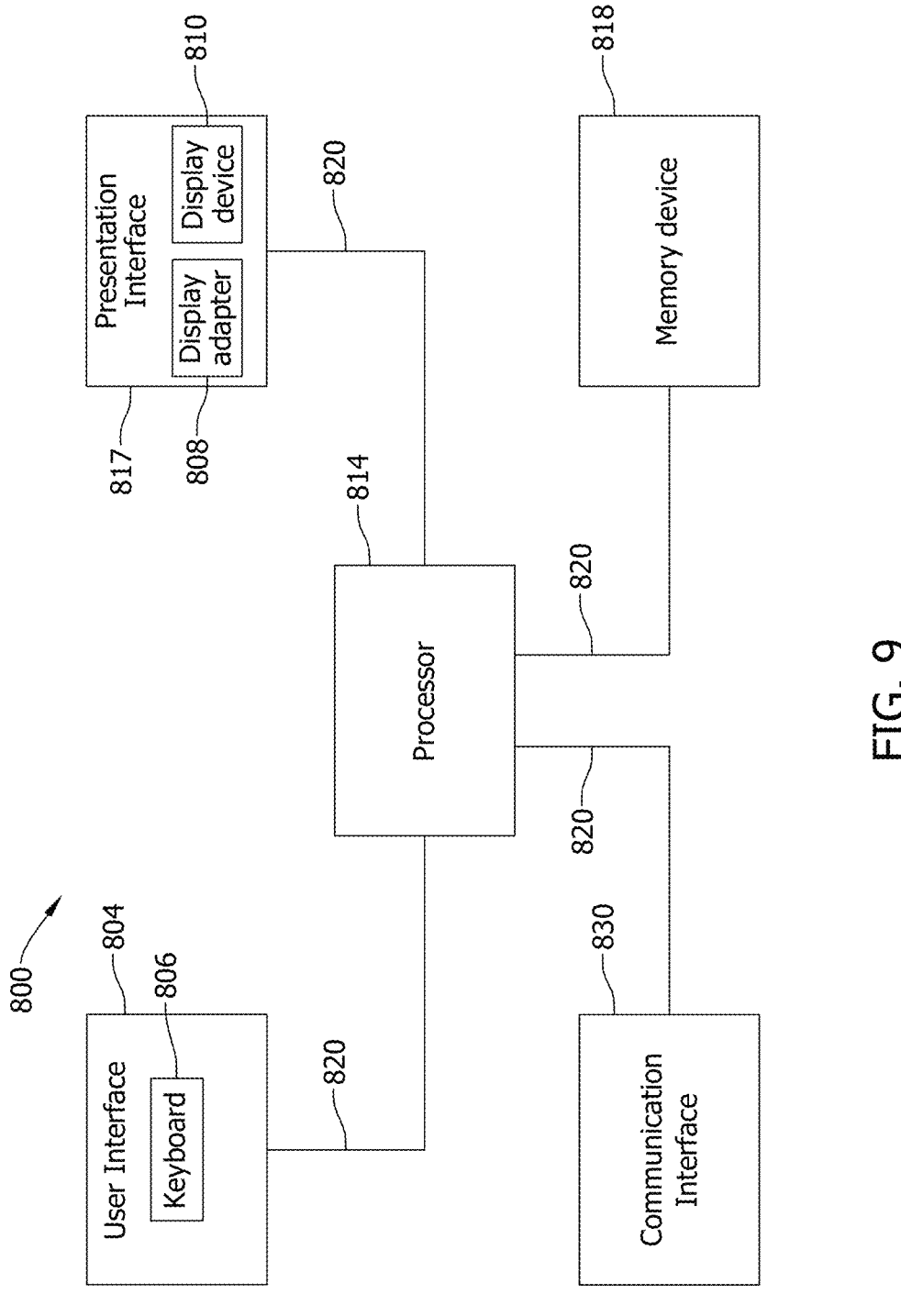
FIG. 9 is a block diagram of an example computing device.

Workstation 12 and artifact reduction computing device 302 described herein may be any suitable computing device 800 and software implemented therein. FIG. 9 is a block diagram of an example computing device 800. In the example embodiment, computing device 800 includes a user interface 804 that receives at least one input from a user. User interface 804 may include a keyboard 806 that enables the user to input pertinent information. User interface 804 may also include, for example, a pointing device, a mouse, a stylus, a touch sensitive panel (e.g., a touch pad and a touch screen), a gyroscope, an accelerometer, a position detector, and/or an audio input interface (e.g., including a microphone).

Moreover, in the example embodiment, computing device 800 includes a presentation interface 817 that presents information, such as input events and/or validation results, to the user. Presentation interface 817 may also include a display adapter 808 that is coupled to at least one display device 810. More specifically, in the example embodiment, display device 810 may be a visual display device, such as a cathode ray tube (CRT), a liquid crystal display (LCD), a light-emitting diode (LED) display, and/or an "electronic ink" display. Alternatively, presentation interface 817 may include an audio output device (e.g., an audio adapter and/or a speaker) and/or a printer.

Computing device 800 also includes a processor 814 and a memory device 818. Processor 814 is coupled to user interface 804, presentation interface 817, and memory device 818 via a system bus 820. In the example embodiment, processor 814 communicates with the user, such as by prompting the user via presentation interface 817 and/or by receiving user inputs via user interface 804. The term "processor" refers generally to any programmable system including systems and microcontrollers, reduced instruction set computers (RISC), complex instruction set computers (CISC), application specific integrated circuits (ASIC), programmable logic circuits (PLC), and any other circuit or processor capable of executing the functions described herein. The above examples are example only, and thus are not intended to limit in any way the definition and/or meaning of the term "processor."

In the example embodiment, memory device 818 includes one or more devices that enable information, such as executable instructions and/or other data, to be stored and retrieved. Moreover, memory device 818 includes one or more computer readable media, such as, without limitation, dynamic random access memory (DRAM), static random access memory (SRAM), a solid state disk, and/or a hard disk. In the example embodiment, memory device 818 stores, without limitation, application source code, application object code, configuration data, additional input events, application states, assertion statements, validation results, and/or any other type of data. Computing device 800, in the example embodiment, may also include a communication interface 830 that is coupled to processor 814 via system bus 820. Moreover, communication interface 830 is communicatively coupled to data acquisition devices.

In the example embodiment, processor 814 may be programmed by encoding an operation using one or more executable instructions and providing the executable instructions in memory device 818. In the example embodiment, processor 814 is programmed to select a plurality of measurements that are received from data acquisition devices.

In operation, a computer executes computer-executable instructions embodied in one or more computer-executable components stored on one or more computer-readable media to implement aspects of the invention described and/or illustrated herein. The order of execution or performance of the operations in embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

Figure 10:
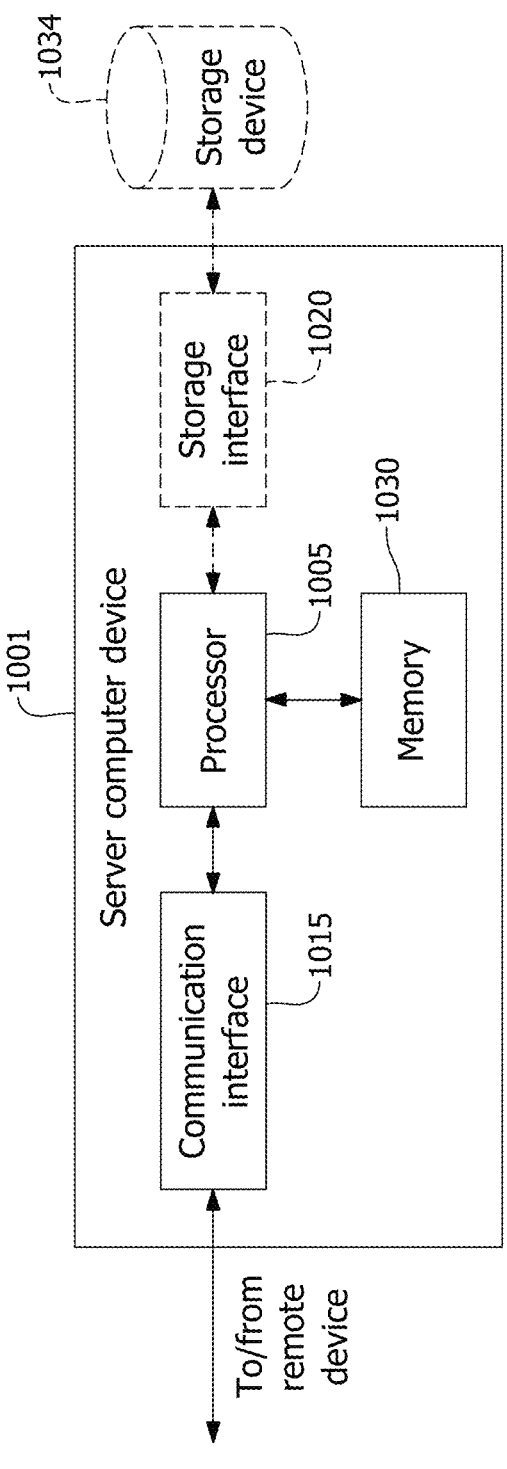
FIG. 10 is a block diagram of an example server computing device.

FIG. 10 illustrates an example configuration of a server computer device 1001 such as computing device 302. Server computer device 1001 also includes a processor 1005 for executing instructions. Instructions may be stored in a memory area 1030, for example. Processor 1005 may include one or more processing units (e.g., in a multi-core configuration).

Processor 1005 is operatively coupled to a communication interface 1015 such that server computer device 1001 is capable of communicating with a remote device or another server computer device 1001. For example, communication interface 1015 may receive data from workstation 12, via the Internet.

Processor 1005 may also be operatively coupled to a storage device 1034. Storage device 1034 is any computer-operated hardware suitable for storing and/or retrieving data. In some embodiments, storage device 1034 is integrated in server computer device 1001. For example, server computer device 1001 may include one or more hard disk drives as storage device 1034. In other embodiments, storage device

1034 is external to server computer device 1001 and may be accessed by a plurality of server computer devices 1001. For example, storage device 1034 may include multiple storage units such as hard disks and/or solid state disks in a redundant array of independent disks (RAID) configuration. storage device 1034 may include a storage area network (SAN) and/or a network attached storage (NAS) system.

In some embodiments, processor 1005 is operatively coupled to storage device 1034 via a storage interface 1020. Storage interface 1020 is any component capable of providing processor 1005 with access to storage device 1034. Storage interface 1020 may include, for example, an Advanced Technology Attachment (ATA) adapter, a Serial ATA (SATA) adapter, a Small Computer System Interface (SCSI) adapter, a RAID controller, a SAN adapter, a network adapter, and/or any component providing processor 1005 with access to storage device 1034.

At least one technical effect of the systems and methods described herein includes (a) reducing channel-dependent artifacts; (b) increased accuracy in artifact reduction; and (c) increased image quality and subject comfort and experience by reducing artifacts associated with certain positioning in radial acquisitions.

Example embodiments of systems and methods of artifact reduction are described above in detail. The systems and methods are not limited to the specific embodiments described herein but, rather, components of the systems and/or operations of the methods may be utilized independently and separately from other components and/or operations described herein. Further, the described components and/or operations may also be defined in, or used in combination with, other systems, methods, and/or devices, and are not limited to practice with only the systems described herein.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A computer-implemented method of reducing artifacts in multi-channel magnetic resonance (MR) images, comprising:
   receiving a plurality of sets of MR images of a volume in a subject, wherein the plurality of sets of MR images are acquired by a radio-frequency (RF) coil assembly having a plurality of channels, and each set of MR images includes a plurality of slices of MR images of the volume acquired by one of the plurality of channels, wherein the one of the plurality of channels corresponds to one or more RF coils in the RF coil assembly;
   estimating a plurality of sets of artifacts in the plurality of sets of MR images by:

inputting the plurality of sets of MR images into a neural network model, the plurality of sets of MR images arranged in an order of channels, wherein the neural network model is configured to estimate artifacts in an MR image inputted into the neural network model; and receiving the plurality of sets of artifacts from the neural network model, the plurality of sets of artifacts arranged in the order of channels, one set of artifacts per channel and corresponding to a set of MR images acquired by the channel;

wherein each set of artifacts is channel dependent due to spatial locations of the one or more RF coils;

reducing artifacts in the plurality of sets of MR images based on the plurality of sets of estimated artifacts deriving MR images of reduced artifacts by combining the plurality of sets of MR images of reduced artifacts; and outputting the MR images of reduced artifacts.

2. The method of claim 1, wherein estimating a plurality of sets of artifacts further comprises:

for each set of MR images, deriving a projected MR image by:

projecting the set of MR images along a slice direction, wherein the projected MR image corresponds to the one of the plurality of channels; and inputting the plurality of sets of MR images by:

inputting the projected MR images into the neural network model.

3. The method of claim 2, wherein projecting the set of MR images further comprises:

deriving the projected MR image by combining the set of MR images along the slice direction as a weighted combination.

4. The method of claim 2, wherein projecting the set of MR images further comprises:

deriving the projected MR image by adding the set of MR images along the slice direction.

5. The method of claim 2, wherein projecting the set of MR images further comprises:

deriving the projected MR image using maximum intensity projection in the slice direction.

6. The method of claim 1, wherein reducing artifacts further comprises:

for each set of MR images, determining an artifact indicator in the set of MR images based on a set of estimated artifacts corresponding to the set of MR images.

7. The method of claim 6, wherein determining an artifact indicator further comprises:

determining the artifact indicator using the neural network model, wherein the neural network model is configured to output the artifact indicator.

8. The method of claim 1, wherein:

reducing artifacts further comprises:

clustering the plurality of sets of MR images based on the plurality of sets of estimated artifacts; and applying weighting to the plurality of sets of MR images based on a cluster to which a set of MR images belongs; and deriving MR images further comprises:

combining the plurality of sets of weighted MR images.

9. The method of claim 8, wherein reducing artifacts further comprises:

determining a number of clusters and/or the weighting based on artifact indicators, signal intensity, and/or signal intensity distribution of the MR images.

10. The method of claim 1, wherein:

reducing artifacts further comprises:

clustering the plurality of sets of MR images based on the plurality of sets of estimated artifacts; and removing one or more sets of MR images in a cluster that has the highest level of artifacts.

11. The method of claim 1, wherein reducing artifacts further comprises:

applying weighting to the plurality of sets of MR images based on the plurality of sets of estimated artifacts.

12. The method of claim 1, wherein the neural network model is configured to estimate streak artifacts, annefacts, and/or motion artifacts in the MR image inputted into the neural network model, and estimating a plurality of sets of artifacts further comprises:

estimating a plurality of sets of streak artifacts, annefacts, and/or motion artifacts in the plurality of sets of MR images using the neural network model.

13. A computer-implemented method of reducing artifacts in magnetic resonance (MR) images, comprising:

receiving one or more sets of MR images of a volume in a subject, wherein the one or more sets of MR images are acquired by a radio-frequency (RF) coil assembly having one or more channels, and each set of MR images includes a plurality of slices of MR images of the volume acquired by one of the one or more channels, wherein the one of the one or more channels corresponds to one or more RF coils in the RF coil assembly;

estimating one or more sets of artifacts in the one or more sets of MR images by:

inputting the one or more sets of MR images into a neural network model, the one or more sets of MR images arranged in an order of channels, wherein the neural network model is configured to estimate artifacts in an MR image inputted into the neural network model; and receiving the one or more sets of artifacts from the neural network model, the one or more sets of artifacts arranged in the order of channels, one set of artifacts per channel and corresponding to a set of MR images acquired by the channel;

wherein each set of artifacts is channel dependent due to spatial locations of the one or more RF coils; and outputting the one or more sets of estimated artifacts.

14. The method of claim 13, wherein estimating one or more sets of artifacts further comprises:

for each set of MR images, deriving a projected MR image by:

projecting the set of MR images along a slice direction, wherein the projected MR image corresponds to the one of the one or more channels; and inputting the one or more sets of MR images by:

inputting the projected MR images into the neural network model.

15. The method of claim 13, wherein the method further comprises:

for each set of MR images, determining an artifact indicator in the set of MR images based on a set of estimated artifacts corresponding to the set of MR images.

16. The method of claim 15, wherein determining an artifact indicator further comprises:

determining the artifact indicator using the neural network model, wherein the neural network model is configured to output the artifact indicator.

17. The method of claim 13, wherein the neural network model is configured to estimate streak artifacts, annefacts, and/or motion artifacts in the MR image inputted into the neural network model, and estimating one or more sets of artifacts further comprises:

estimating one or more sets of streak artifacts, annefacts, and/or motion artifacts in the one or more sets of MR images using the neural network model.

18. A computer-implemented method of reducing artifacts in multi-channel magnetic resonance (MR) images, comprising:

receiving a plurality of sets of first MR images of a volume in a subject, wherein the plurality of sets of first MR images are acquired by a radio-frequency (RF) coil assembly having a plurality of channels, wherein one of the plurality of channels corresponds to one or more RF coils in the RF coil assembly;

reducing artifacts in the plurality of sets of first MR images based on a plurality of sets of estimated artifacts, the plurality of sets of first MR images arranged in an order of channels wherein the plurality of sets of estimated artifacts are estimated by:

inputting a plurality of sets of second MR images into a neural network model, the plurality of sets of second MR images arranged in the order of channels, wherein the neural network model is configured to estimate artifacts in an MR image inputted into the neural network model, and the plurality of sets of second MR images are MR images of the volume acquired by the RF coil assembly; and receiving the plurality of sets of estimated artifacts from the neural network model, the plurality of sets of estimated artifacts arranged in the order of channels, one set of artifacts per channel and corresponding to a set of MR images acquired by the channel;

wherein each set of artifacts is channel dependent due to spatial locations of the one or more RF coils;

deriving first MR images of reduced artifacts by combining the plurality of sets of first MR images of reduced artifacts; and outputting the first MR images of reduced artifacts.

19. The method of claim 1, wherein the neural network model is trained with generated training images including generated natural images with channel-dependent artifacts.

20. The method of claim 13, wherein the neural network model is trained with generated training images including generated natural images with channel-dependent artifacts.

* * * * *